United States Patent
Glenn et al.

(10) Patent No.: US 6,572,944 B1
(45) Date of Patent: Jun. 3, 2003

(54) STRUCTURE FOR FABRICATING A SPECIAL-PURPOSE DIE USING A POLYMERIZABLE TAPE

(75) Inventors: Thomas P. Glenn, Gilbert, AZ (US); Steven Webster, Chandler, AZ (US); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 119 days.

(21) Appl. No.: 09/764,190

(22) Filed: Jan. 16, 2001

(51) Int. Cl.⁷ ................................. B32B 9/00
(52) U.S. Cl. ................ 428/40.1; 24/426.3; 24/426.4; 24/426.5; 428/41.7; 428/42.1; 428/42.2; 428/203; 428/345; 428/346; 428/354; 428/913; 438/464; 438/976
(58) Field of Search ............. 428/40.1, 41.7, 428/42.1, 42.2, 203, 345, 346, 354, 913; 29/426.3, 426.4, 426.5; 438/464, 976

(56) References Cited

U.S. PATENT DOCUMENTS

| | | | |
|---|---|---|---|
| 5,362,681 A | 11/1994 | Roberts, Jr. et al. | 437/226 |
| 5,435,876 A | 7/1995 | Alfaro et al. | 156/247 |
| 5,641,714 A | 6/1997 | Yamanaka | 438/14 |
| 5,981,361 A | 11/1999 | Yamada | 438/464 |
| 6,176,966 B1 * | 1/2001 | Tsujimoto | 29/426.3 |
| 6,245,593 B1 | 6/2001 | Yoshihara et al. | 438/106 |
| 6,425,971 B1 | 7/2002 | Silverbrook | 156/230 |

OTHER PUBLICATIONS

WEB page Article, Nitto Denko America, Inc., "Answering the Sophisticated Demands of the Semiconductor Manufacturing Process," copyright 1995–1999, 1 page.

* cited by examiner

Primary Examiner—Nasser Ahmad
(74) Attorney, Agent, or Firm—Gunnison, McKay & Hodgson, L.L.P.; Serge J. Hodgson

(57) ABSTRACT

A structure for protecting a special-purpose area of an image sensor die or a micromachine die during singulation of the die from a wafer includes a protective layer that has a polymerized upper zone and an unpolymerized lower zone. At least part of the unpolymerized lower zone has an adhesive lower surface that is attached to a top surface of the wafer so that the protective layer overlies and protects the special-purpose area during either frontside or backside sawing. The unpolymerized lower zone is then entirely polymerized to make the adhesive lower surface nonadhesive to facilitate removal of the protective layer from the die.

25 Claims, 6 Drawing Sheets

STRUCTURE FOR FABRICATING A SPECIAL-PURPOSE DIE USING A POLYMERIZABLE TAPE

BACKGROUND OF THE INVENTION

1. Field of the Invention

The present invention relates generally to techniques for fabrication of integrated circuit chips, and more particularly, to a structure for protection of special-purpose chips, such as image sensors and the like.

2. Description of Related Art

A number of integrated circuit chips are batch processed as an array of chips on a silicon wafer. The wafer is then cut, or diced, with a saw blade or laser beam to separate, or singulate, the individual chips, or dies, from the wafer.

The top surface of a conventional integrated-circuit die has various electrical circuit elements formed thereupon. Conventional integrated-circuit dies often have a protective passivation layer formed over the electrical circuit elements and covering the top surface of the die. Conventionally, oxide areas, scribe lines, or other indicia are provided on the wafer surface to assist in guiding a saw blade through singulation streets between the various dies. Singulation of conventional dies from a wafer includes mounting the bottom surface of the wafer to a saw pallet using, for example, a double-sided adhesive tape such as blue NITTO tape and passing the saw blade through the wafer. This sawing process and other singulation processes produce silicon shards and particulates. The conventional passivation layer protects the underlying circuitry from the shards, particulates, and water used in the singulation process.

For certain applications, the top surface of a die, e.g., a micromachine die, has formed on it a special-purpose area having various types of special-purpose devices, such as, for example, micromachines. It is important that the special-purpose area not be contacted and contaminated with silicon shards and particulates, or water from the singulation process. Otherwise, the special-purpose area is damaged or destroyed. Consequently, the special-purpose device must be protected from undesired contamination or contact during the die-singulating process.

FIG. 1 illustrates one type of prior art technique for protecting a special-purpose area, e.g., containing a micromachine, during a wafer dicing process, as disclosed in a Roberts, Jr. 'et al., U.S. Pat. No. 5,362,681, which is herein incorporated by reference in its entirety. A wafer 10 of silicon or other suitable material is typically processed to produce a plurality of special-purpose dies, or chips, 12 (hereinafter dies 12). The dies 12 are arranged in a two-dimensional array on the wafer 10 and are separated by singulation streets 14 between adjacent dies 12. Each die 12 includes a special-purpose area 16 that is formed on a top surface 17 of the die 12. Each special-purpose area 16 includes a special-purpose device, such as a micromachine. When the wafer 10 is singulated into separate dies 12, silicon shards and particulates, as well as a silicon and water slurry are produced. Contact with these byproducts of sawing may harm the special-purpose areas 16.

The prior art technique of FIG. 1 uses two separate layers of MYLAR tape for protecting the special-purpose areas 16 from silicon shards, particulates, and slurry during singulation of the dies by sawing of the wafer 10. A first layer 18 of 5 mil (0.13 mm) MYLAR tape has a lower surface 19 that is fixed to the top surface 17 of the dies 12 and more generally of the wafer 10 with a thin layer 20 of adhesive material. If the first layer 18 were to completely cover the top surface 17 of the dies 12, it would permanently adhere to and damage the special-purpose areas 16.

Consequently, the first layer 18 is required to have a set of precisely positioned, spaced-apart punched holes 22 that are mechanically punched into the first layer 18 to precisely accommodate the special-purpose areas 16. The punched holes 22 need to have diameters large enough to provide clearance for the special-purpose areas 16. A second separate layer 24 of 3 mil (0.07 mm) MYLAR tape is fixed to the upper surface 25 of the first layer 18 to seal the top end of the mechanically punched holes 22. The holes 22 in the first layer 18 must be precisely aligned with the aid of video cameras over the special-purpose areas 16 on the wafer 10 prior to attachment of the first layer 18 of MYLAR tape to the top surface 17 of the wafer 10 with the thin layer 20 of adhesive material. After sawing, the layers 18, 24 are removed with tweezers.

It should be readily apparent that mechanically punching the holes 22 in the first layer 18, precisely aligning the holes 22 in the first layer 18 over the special-purpose areas 16 on the wafer 10, and removing the layers 18, 24 with tweezers is more expensive and complex than the prior art technique of simply covering a wafer with a passivation layer during processing of conventional integrated-circuits on the wafer to protect underlying electrical circuitry elements during die sawing.

Consequently, a need exists for a simple, economical technique for protecting special-purpose areas on the surface of a wafer from contaminants during singulation of dies from the wafer.

SUMMARY OF THE INVENTION

According to the principles of this invention, a structure is provided for protecting a special-purpose area located on a top surface of a special-purpose die during singulation of the special-purpose die from a wafer, where the special-purpose die has a bottom surface. The structure includes a protective layer of tape having an adhesive lower surface formed by a polymerizable material. The adhesive lower surface of the protective layer of tape is attached to the top surface of the special-purpose die to overlie and/or contact the special-purpose area on the special-purpose die and to protect the special-purpose area during sawing and detachment of the special-purpose die.

In one embodiment, the protective layer of tape has a first polymerized upper zone and a second lower zone that is unpolymerized and that has an adhesive lower surface.

The structure further includes sawing indicia located on a top surface of the wafer and visible through the protective layer of tape to aid in sawing through the wafer from the top surface of the special-purpose die. The special-purpose die is one of a plurality of special-purpose dies arranged in an array on the wafer. According to one aspect of the invention, the special-purpose dies are selected from a group consisting of image sensor dies and micromachine dies.

Another embodiment of the invention includes a structure for protecting a special-purpose area located on a top surface of a special-purpose die. The structure includes a protective layer having a first polymerized upper zone and having a second lower zone. The second lower zone has at least a portion thereof unpolymerized and with an adhesive lower surface. The adhesive lower surface of the unpolymerized portion of the second lower zone is attached to the top surface of the special-purpose die so that the protective layer overlies and protects the special-purpose area of the special-purpose die. In this embodiment, the adhesive lower surface of the unpolymerized portion of the second lower zone is attached to a top surface of a wafer comprising the special-purpose die so that a polymerized portion of the second lower zone overlies and/or contact the special-purpose area.

Also in accordance with the present invention, a method includes adhesively mounting an adhesive lower surface of a protective layer to a top surface of a die such as an image sensor die or a micromachine die. A special-purpose area on the top surface of the die is contacted and protected by the protective layer. The protective layer includes a polymerizable material, which includes the adhesive lower surface.

The method further includes rendering the adhesive lower surface of the protective layer to be nonadhesive. For example, the adhesive lower surface is rendered nonadhesive by polymerizing the polymerizable material of the protective layer with ultraviolet radiation.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
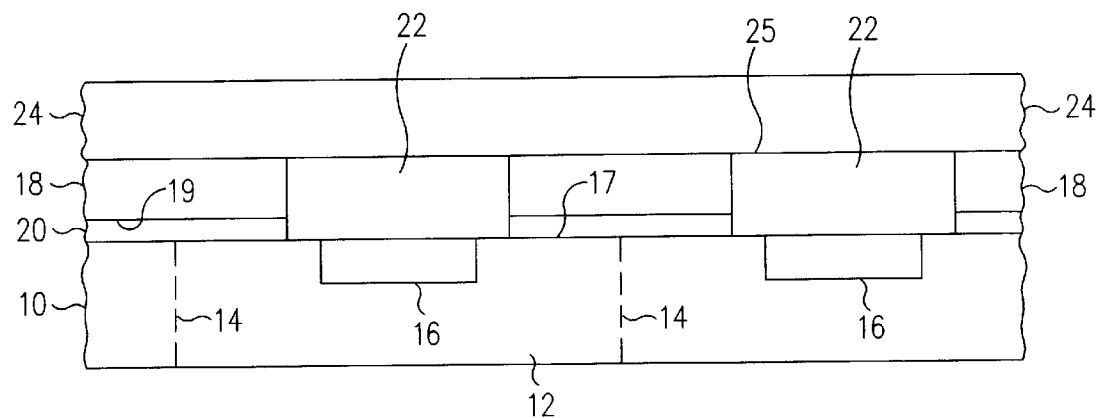
FIG. 1 is an enlarged cross-sectional view of a prior art technique that uses two separate layers of tape to protect a special-purpose area on a special-purpose die during die singulation.

In accordance with one embodiment of the present invention, a structure (FIG. 5) is provided for protecting a special-purpose area 50 of a special-purpose die 48, hereinafter die 48, during frontside (FIG. 6) or backside (FIG. 10) singulation of the die 48 from a wafer 46 using a partially polymerized protective layer 36. The partially polymerized protective layer 36 has an adhesive lower surface 42 that is adhesive, but that can be rendered nonadhesive with ultraviolet radiation.

In contrast, the prior art (FIG. 1) requires a first layer 18 and a second separate layer 24 to singulated the wafer 10, where the first layer 18 has holes 22 mechanically punched in it to provide clearance for special-purpose areas 16. The second separate layer 24 covers the holes 22. This technique requires precision punching of the holes 22 in the first layer 18. In addition, the holes 22 must be precisely aligned with the special-purpose area 16. Further, the first layer 18 and the second separate layer 24 must be removed with tweezers after singulation of the wafer 10. These functions are costly and time consuming in comparison to the present invention.

In accordance with an alternative embodiment of the invention (FIGS. 12 and 13), an unpolymerized lower zone 92 of a partially polymerized protective layer 86 is selectively exposed to the ultraviolet radiation 100 to form a partially polymerized lower zone 92A having unpolymerized regions 106 with adhesive lower surfaces 110. Other polymerized regions 104A of the partially polymerized lower zone 92A are entirely polymerized and have nonadhesive lower surfaces 108 that are not adhesive, which overlie and/or contact special-purpose areas 126 (FIG. 14) without adhering. After singulation, the unpolymerized regions 106 are polymerized with ultraviolet radiation 145 (FIG. 17) to release the adhesive lower surfaces 110 from attachment to a top surface 120 of a die 124.

Figure 20:
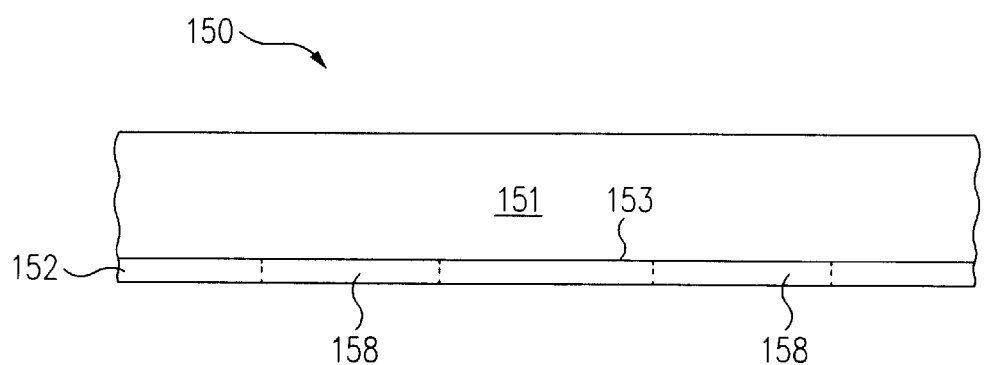
FIG. 20 is an enlarged cross-sectional view of a protective layer according to another embodiment of the invention.

FIG. 20 illustrates an alternative embodiment of the invention, which includes a protective layer 150 formed by a layer of tape 151 coated with a polymerizable adhesive material 152 on a lower, e.g., first, surface 154 of the layer of tape 151. The protective layer 150 is then adhesively attached to the top surface of the special-purpose die to overlie and to protect the special-purpose die. After singulation of the special-purpose die from a wafer, the polymerizable adhesive material 152 of the protective layer 150 is polymerized with ultraviolet radiation to release the protective layer 150 from attachment to the top surface of the special-purpose die.

Figure 2:
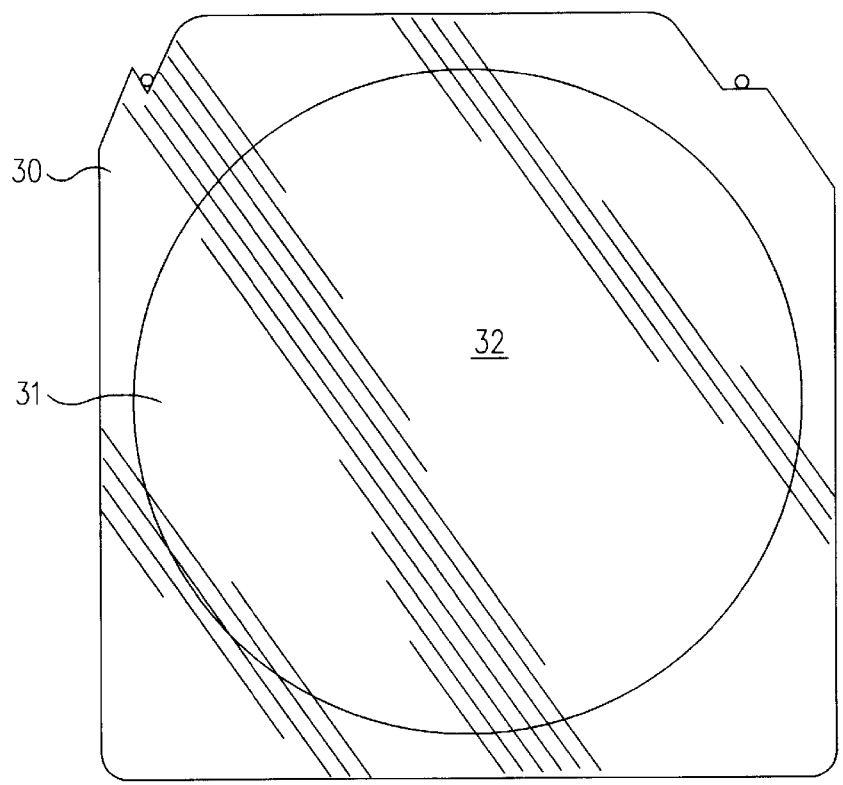
FIG. 2 is a top plan view of a wafer holder for a polymerizable protective layer according to the invention.

More particularly, FIG. 2 illustrates a wafer holder 30 that is a metal or plastic frame having an open central region 31. A polymerizable material 32, e.g., a single layer, sheet, or tape, illustratively having a thickness in the range of 4–12 mil (0.1–0.3 mm), is attached to the wafer holder 30 and covers the open central region 31. As described herein below, the polymerizable material 32 is selectively polymerized, sometimes called cured, with energy, e.g., ultraviolet radiation, to provide polymerized and unpolymerized zones.

Generally, polymerizing includes changing, cross-linking, setting up, or gelling a polymerizable material using energy, such as, for example, ultraviolet radiation. Generally, polymerizable material becomes polymerized, e.g., changed, cross-linked, set up, or gelled, when exposed to energy, e.g., ultraviolet radiation. Although ultraviolet radiation is discussed herein as the energy, it is understood that other types of energy are used in other embodiments. Further, those of skill in the art will recognize that the exposure intensity and times used in the various processes described herein will vary from application to application according to the particular polymerizable material used and the specific results desired.

Figure 3:
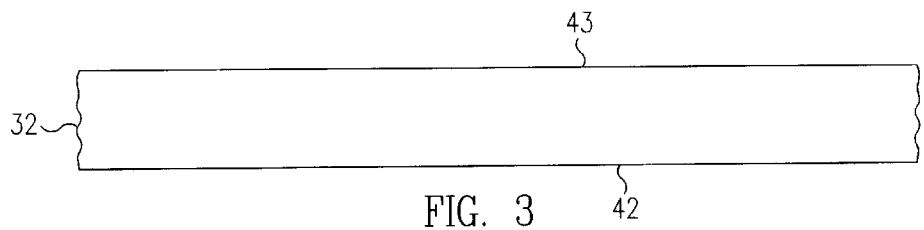
FIG. 3 is an enlarged cross-sectional view of the polymerizable protective layer of FIG. 2 according to the invention.

FIG. 3 illustrates the polymerizable material 32. Illustratively, the polymerizable material 32 is prepared by spreading a gel of polymerizable material on a stainless steel plate to form a thin gel layer having a thickness of 4–12 mils (0.1–0.3 mm), but can be formed using other techniques. The polymerizable material 32 has an adhesive lower surface 42 and an adhesive upper surface 43.

Figure 4:
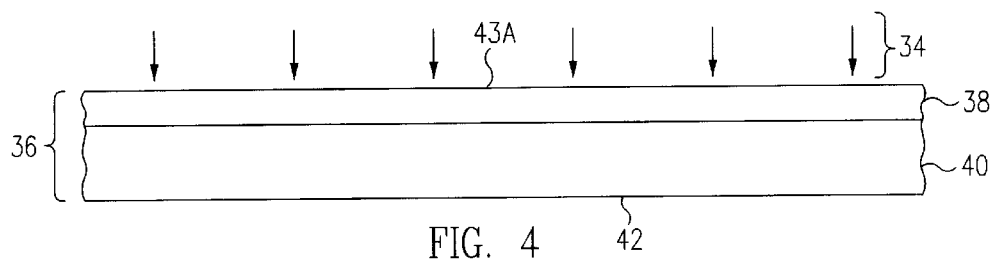
FIG. 4 is an enlarged cross-sectional view of the polymerizable protective layer of FIG. 3 that has been irradiated to provide a partially polymerized protective layer according to the invention.

FIG. 4 illustrates a partially polymerized protective layer 36 during formation. Referring to FIGS. 3 and 4 together, the polymerizable material 32 is irradiated with ultraviolet radiation 34 from an ultraviolet radiation source (not shown). This partially polymerizes the polymerizable material 32 to form the partially polymerized protective layer 36. The partially polymerized protective layer 36 has a polymerized upper zone 38 and an unpolymerized lower zone 40. The adhesive upper surface 43 becomes a nonadhesive surface 43A of the polymerized upper zone 38 and the adhesive lower surface 42 of the unpolymerized lower zone 40 remains unchanged.

Figure 5:
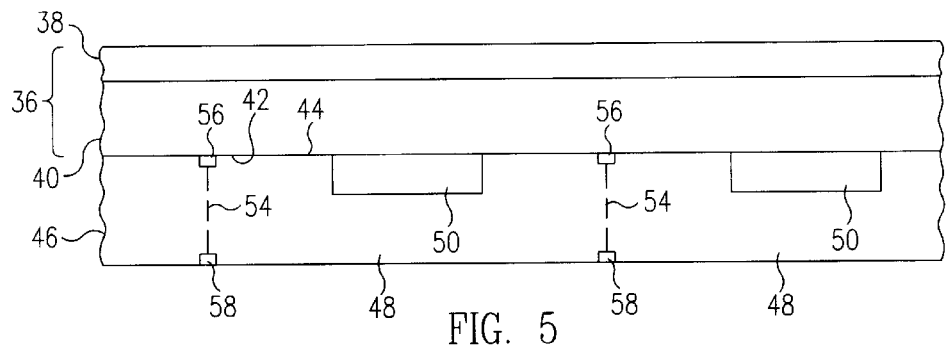
FIG. 5 is an enlarged cross-sectional view of the partially polymerized protective layer of FIG. 4 that is attached to the top surface of a wafer having a special-purpose die formed therein according to the invention.

FIG. 5 illustrates the adhesive lower surface 42 of the partially polymerized protective layer 36 adhesively attached to a top surface 44 of dies 48 and more generally of a wafer 46. The wafer 46 has at least one die 48, e.g., a micromachine chip or image sensor chip. Special-purpose areas 50, sometimes called active areas, are on the top surfaces 44 of the dies 48. The special-purpose areas 50 contain, or are, for example, image sensor arrays and/or micromachines such as inertial switches, and similar devices (not shown) that interface to the external environment. In this embodiment, the adhesive lower surface 42 and more generally the partially polymerized protective layer 36 overlies and/or contacts the special-purpose areas 50. Advantageously, no special alignment of the partially polymerized protective layer 36 with respect to the wafer 46 is required. This is in stark contrast to the prior art, which required that the specially punched holes 22 (FIG. 1) be precisely positioned on the wafer 10.

The dies 48 are typically part of a two-dimensional array and are separated by singulation streets 54 between adjacent dies 48. Singulation streets 54 are identified in a number of ways. For frontside sawing, scribe lines 56, e.g., oxide strips, between the dies 48 are used as saw guides. For backside sawing, fiducials 58, e.g., laser marks, are used as saw guides.

Figure 6:
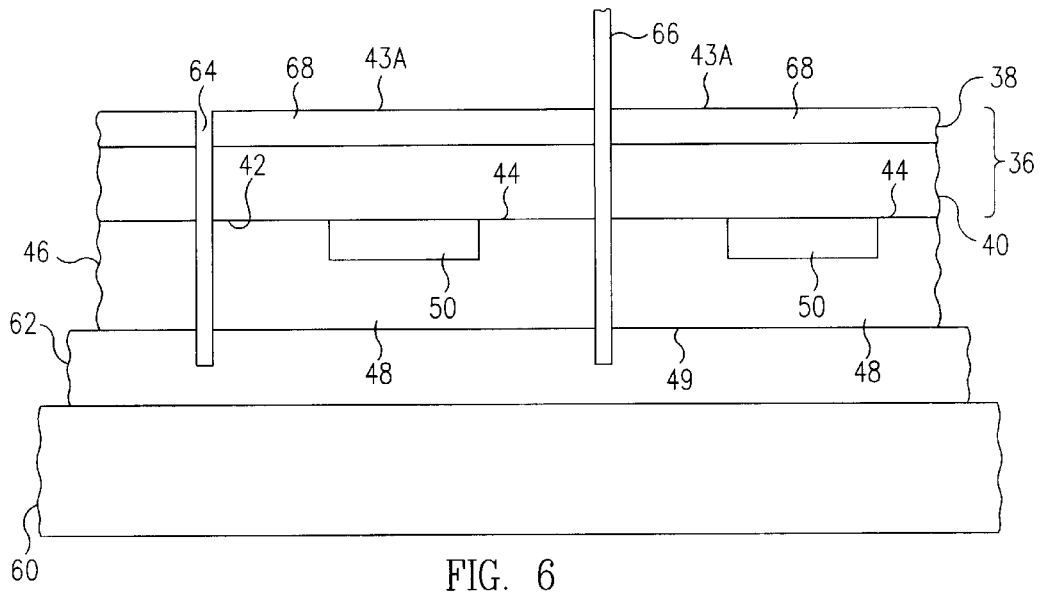
FIG. 6 is an enlarged cross-sectional view of the arrangement of FIG. 5 attached to a saw pallet with a base layer of tape according to the invention.

FIG. 6 illustrates frontside sawing of the wafer 46. As shown in FIG. 6, a bottom surface 49 of the wafer 46 is mounted to a saw pallet 60 with a base layer 62 of conventional tape, such as blue NITTO sticky tape, that is commonly used in wafer singulation operations. The wafer 46 has front-side saw grooves 64 cut through the wafer 46 with a saw blade 66 using the scribe lines 56 illustratively shown in FIG. 5, which are visible through the partially polymerized protective layer 36, or other indicia provided on the top surface 44 of the wafer 46 or on the partially polymerized protective layer 36. Sawing through the wafer 46 singulates dies 48 such that each die 48 has an attached overlying portion 68 of the partially polymerized protective layer 36.

A pick-and-place machine attaches to the nonadhesive surface 43A of the overlying portion 68 to remove the die 48 and the overlying portion 68 from the base layer 62 and more generally from the saw pallet 60. The overlying portion 68 attached to the top surface 44 of the die 48 remains on the die 48 to protect the special-purpose area 50 until such time as the die 48 is to be packaged or tested.

Figure 7:
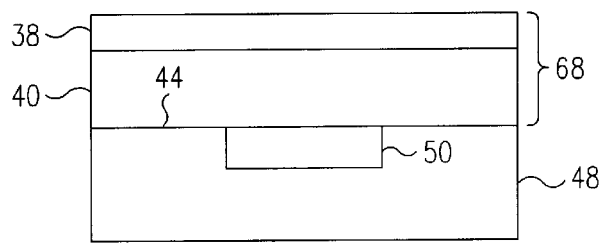
FIG. 7 is an enlarged cross-sectional view of a singulated die that has been picked from the base layer of tape of FIG. 6 with an overlying portion of the partially polymerized protective layer still attached to the top surface of the die according to the invention.

FIG. 7 illustrates a singulated die 48 that has been picked off of the saw pallet 60 of FIG. 6 with the overlying portion 68 still attached to the top surface 44 of the die 48.

Figure 8:
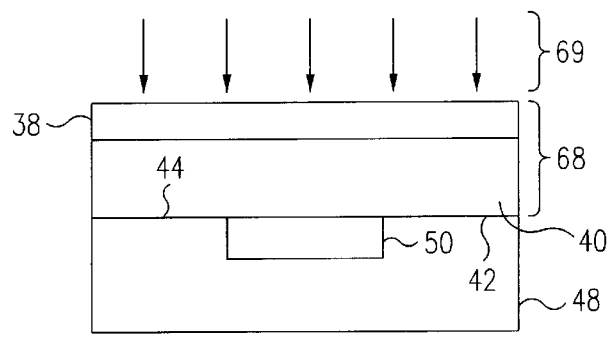
FIG. 8 is an enlarged cross-sectional view of the overlying portion of FIG. 7 being irradiated to form an entirely polymerized portion according to the invention.

FIG. 8 illustrates the overlying portion 68 of FIG. 7 being irradiated with ultraviolet radiation 69 to polymerize the unpolymerized lower zone 40 of the overlying portion 68 to form an entirely polymerized portion 68A (FIG. 9) and to render the adhesive lower surface 42 nonadhesive.

Figure 9:
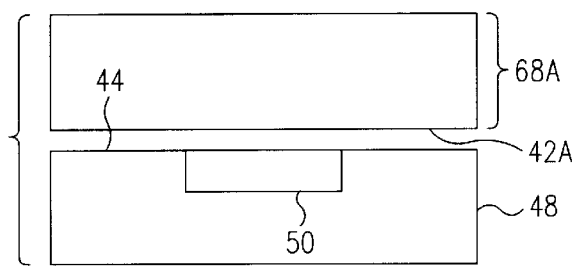
FIG. 9 is an enlarged cross-sectional view of the singulated die of FIG. 8 detached, or separated, from the entirely polymerized portion according to the invention.

FIG. 9 is a cross-sectional view of the singulated die 48 of FIG. 8 and the entirely polymerized portion 68A removed from the top surface 44 of the die 48. The entirely polymerized portion 68A includes a nonadhesive lower surface 42A that is not adhesive, i.e., is not sticky. Since the nonadhesive lower surface 42A is not adhesive, the entirely polymerized portion 68A is easily removed from the top surface 44 of the die 48. More particularly, the entirely polymerized portion 68A releases special-purpose area 50 and is thus removed without damaging or destroying special-purpose area 50.

Figure 10:
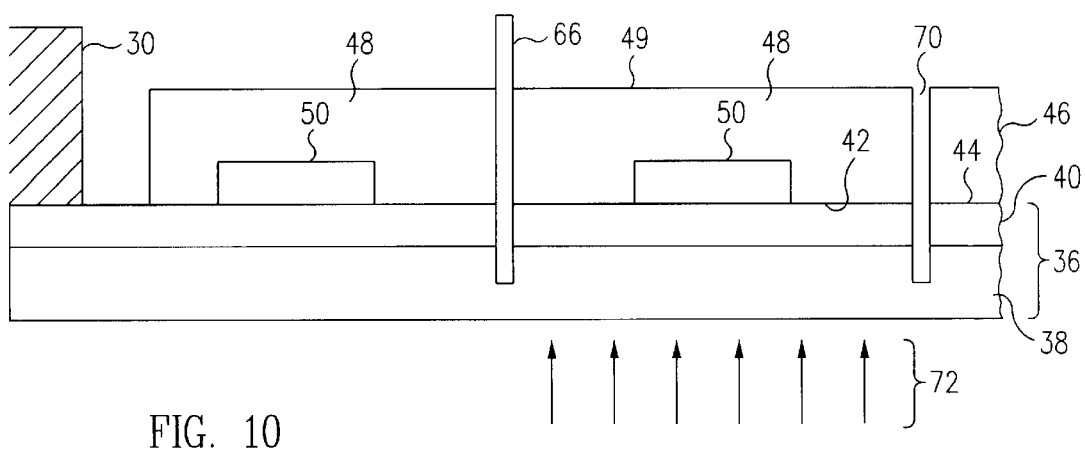
FIG. 10 is an enlarged cross-sectional view of the arrangement of FIG. 5 showing the partially polymerized protective layer supporting the wafer according to an alternative embodiment of the invention.

FIG. 10 illustrates backside sawing where the wafer 46 is attached to the partially polymerized protective layer 36 of FIG. 5 in accordance with an alternative embodiment of the invention. The wafer 46 is suspended on the partially polymerized protective layer 36 to facilitate backside sawing.

FIG. 10 shows that a peripheral margin of the partially polymerized protective layer 36 is fixed to the wafer holder 30 that is illustrated in FIG. 2. Backside saw grooves 70 are cut through the bottom surface 49 of the wafer 46 with a saw blade 66 guided using fiducials 58 illustratively shown in FIG. 5 or other indicia such as mechanically punched holes in the partially polymerized protective layer 36 as saw guides. Sawing through the wafer 46 singulates dies 48 yet only scores and does not singulated the partially polymerized protective layer 36. After singulation, dies 48 are released from the partially polymerized protective layer 36 by irradiating the partially polymerized protective layer 36 with ultraviolet radiation 72. More particularly, this irradiation entirely polymerized the unpolymerized lower zone 40 and renders the adhesive lower surface 42 nonadhesive so that the dies 48 are easily removed without damaging or destroying the special-purpose areas 50.

Figure 11:
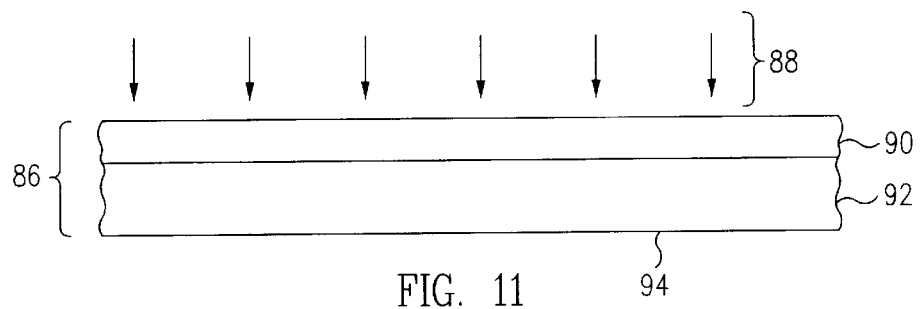
FIG. 11 is an enlarged cross-sectional view of a partially polymerized protective layer according to another embodiment of the invention.

FIG. 11 illustrates that a partially polymerized protective layer 86 is formed to have a polymerized upper zone 90 and an unpolymerized lower zone 92 having an adhesive lower surface 94 by ultraviolet radiation 88 in a manner similar to that described above in reference to FIG. 4.

Figure 12:
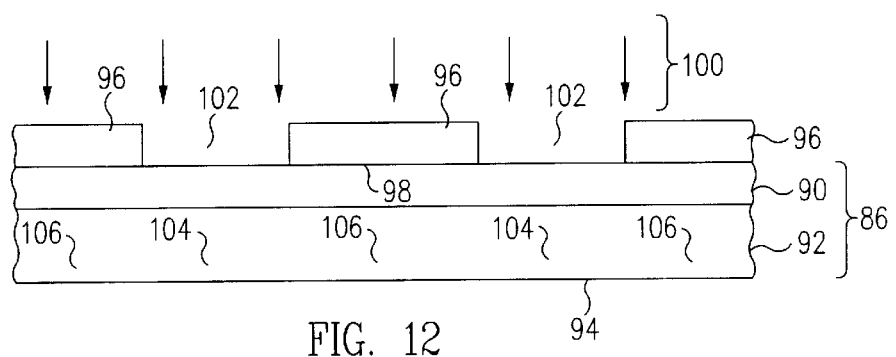
FIG. 12 is an enlarged cross-sectional view of the partially polymerized protective layer of FIG. 11 during selective irradiation according to the invention.
Figure 13:
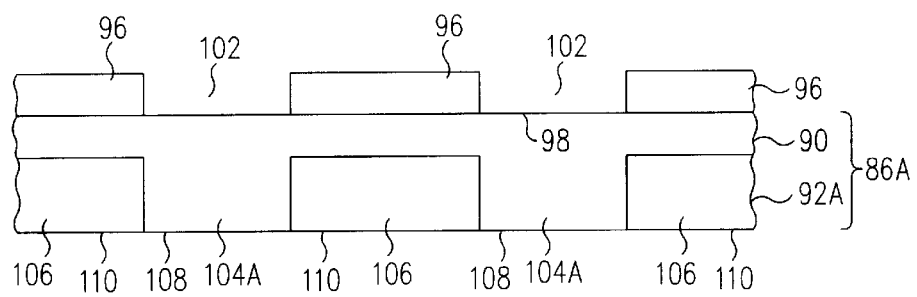
FIG. 13 is an enlarged cross-sectional view of a partially entirely polymerized protective layer formed from the partially polymerized protective layer of FIG. 12 according to the invention.

FIGS. 12 and 13 illustrate an ultraviolet mask 96 placed on or adjacent to a nonadhesive surface 98 of the polymerized upper zone 90. Ultraviolet radiation 100 is directed through openings 102 in the ultraviolet mask 96 and into unprotected regions 104 of the unpolymerized lower zone 92 beneath and exposed through the openings 102 as shown in FIG. 12. However, the ultraviolet mask 96 prevents the ultraviolet radiation 100 from entering into protected regions 106, which are covered by and masked by ultraviolet mask 96.

Referring now to FIG. 13, after irradiation with the ultraviolet radiation 100, a partially entirely polymerized protective layer 86A is formed. Partially entirely polymerized protective layer 86A includes polymerized upper zone 90 and a partially polymerized lower zone 92A. Partially polymerized lower zone 92A includes protected regions 106 (hereinafter unpolymerized regions 106) and polymerized regions 104A. Unpolymerized regions 106 are surrounded by and between the polymerized regions 104A. Nonadhesive lower surfaces 108 of the polymerized regions 104A are not adhesive, while adhesive lower surfaces 110 of the unpolymerized regions 106 remain adhesive. Although the various regions and surfaces may be described as separate regions and surfaces herein and illustrated as separate regions and surfaces in the figures, those of skill in the art will understand that the separate regions and surfaces may be connected as part of a single region or surface.

Figure 14:
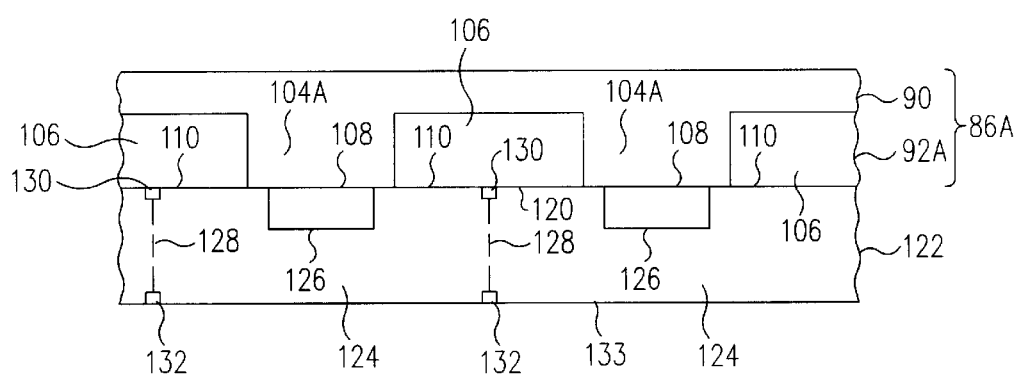
FIG. 14 is an enlarged cross-sectional view of the partially entirely polymerized protective layer of FIG. 13 laid over a wafer according to the invention.

FIG. 14 illustrates the partially entirely polymerized protective layer 86A with adhesive lower surfaces 110 attached to a top surface 120 of a wafer 122. The wafer 122 has one or more special-purpose dies 124 (hereinafter dies 124) provided therein, each of which has a special-purpose area 126, sometimes called an active area, formed on the top surface 120 of the die 124 and more generally of the wafer 122. The dies 124 are typically part of a two-dimensional array and are separated by singulation streets 128 between adjacent dies 124. The singulation streets 128 are identified with scribe lines 130 on the top surface 120 of the wafer 122 and/or with fiducials 132 on a bottom surface 133 of the wafer 122.

In this embodiment, the nonadhesive lower surfaces 108 of the polymerized regions 104A overlie and/or contact the corresponding special-purpose areas 126 of the dies 124. The adhesive lower surfaces 110 of the unpolymerized regions 106 overlie and contact peripheral areas on the top surface 120 of the wafer 122 around special-purpose areas 126, which include die pads (not shown) located, for example, adjacent singulation streets 128. The polymerized regions 104A have a contrast to the unpolymerized regions 106, e.g., light/dark or different color, facilitating alignment of the partially entirely polymerized protective layer 86A with the wafer 122 although other alignment techniques are used in other embodiments.

Advantageously, special-purpose areas 126 are contacted only by nonadhesive lower surfaces 108 and thus special-purpose areas 126 are not adhesively attached to partially entirely polymerized protective layer 86A. In this manner, damage or destruction of special-purpose areas 126, e.g., which are particularly sensitive to any sort of adhesive contact, is avoided. Further, only one single protective layer, i.e., partially entirely polymerized protective layer 86A, is handled to protect the special-purpose area 126, which is relatively simple and thus low cost.

Figure 15:
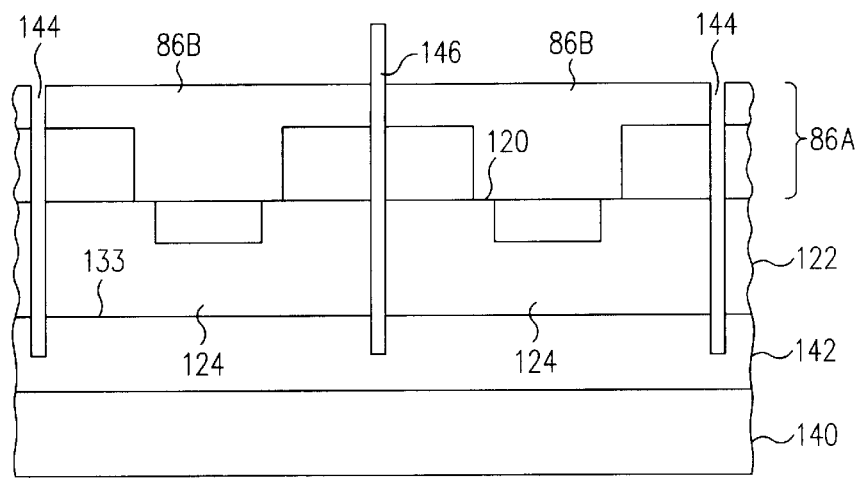
FIG. 15 is an enlarged cross-sectional view of the arrangement of FIG. 14 attached to a saw pallet with a base layer of tape according to the invention.

Referring now to FIG. 15, the bottom surface 133 of the wafer 122 is mounted to a saw pallet 140 with a base layer 142 of conventional tape. The wafer 122 has front-side saw grooves 144 cut through it with a saw blade 146 using the scribe lines 130 illustratively shown in FIG. 14 or other indicia provided on the top surface 120 of the wafer 122 or in the partially entirely polymerized protective layer 86A. Sawing through the wafer 122 singulates the dies 124 such that each die 124 has an attached overlying portion 86B of the partially entirely polymerized protective layer 86A.

Figure 16:
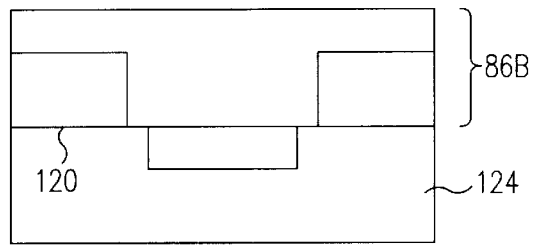
FIG. 16 is an enlarged cross-sectional view of a singulated die that has been picked from the base layer of tape of FIG. 15 with an overlying portion of the partially entirely polymerized protective layer still attached to the top surface of the die according to the invention.

FIG. 16 illustrates a singulated die 124 that has been picked off of the saw pallet 140 of FIG. 15 with the overlying portion 86B still attached to the top surface 120.

Figure 17:
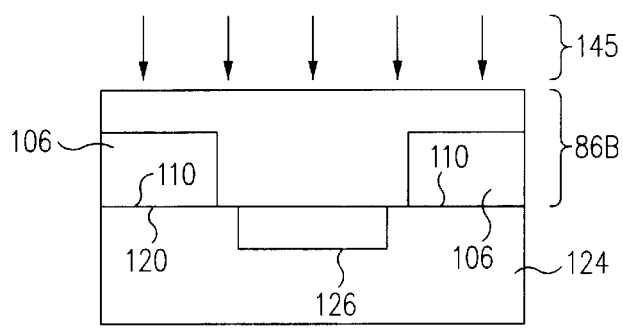
FIG. 17 is an enlarged cross-sectional view of the overlying portion of FIG. 16 being irradiated to form an entirely polymerized portion according to the invention.
Figure 18:
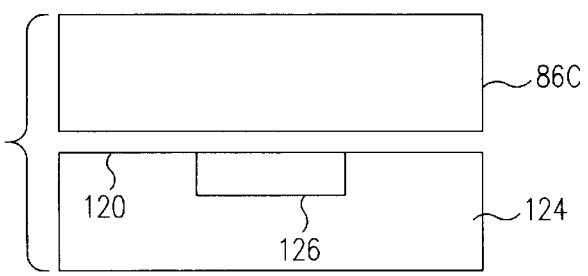
FIG. 18 is an enlarged cross-sectional view of the singulated die of FIG. 17 detached, or separated, from the entirely polymerized portion according to the invention.

FIG. 17 illustrates the overlying portion 86B being irradiated with ultraviolet radiation 145 to polymerize the unpolymerized regions 106 to form an entirely polymerized portion 86C (FIG. 18) and to render the adhesive lower surface 110 nonadhesive. The entirely polymerized portion 86C is easily removed from the top surface 120 of the die 124, as illustrated in FIG. 18, without damaging or destroying the special-purpose area 126.

Figure 19:
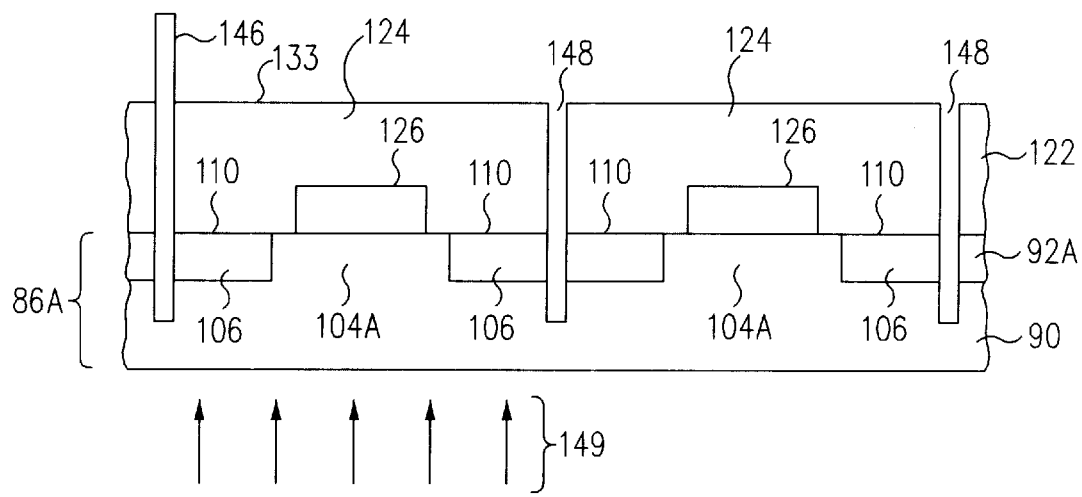
FIG. 19 is an enlarged cross-sectional view of the arrangement of FIG. 14 showing the partially entirely polymerized protective layer supporting the wafer according to an alternative embodiment of the invention.

FIG. 19 illustrates backside sawing in accordance with an alternative embodiment similar to that shown in FIG. 10. Referring now to FIG. 19, the wafer 122 is suspended on the partially entirely polymerized protective layer 86A to facilitate backside sawing. A peripheral margin (not shown) of the partially entirely polymerized protective layer 86A is fixed to the wafer holder 30 that is illustrated in FIG. 2. Backside saw grooves 148 are cut through the bottom surface 133 of the wafer 122 with the saw blade 146 guided using fiducials 132 illustratively shown in FIG. 14 or other indicia such as mechanically punched holes in the partially entirely polymerized protective layer 86A as saw guides. Sawing through the wafer 122 singulates the dies 124 yet only scores and does not singulate the partially entirely polymerized protective layer 86A.

After singulation, the dies 124 are released from the partially entirely polymerized protective layer 86A by irradiating the partially entirely polymerized protective layer 86A with ultraviolet radiation 149. More particularly, this irradiation entirely polymerizes the unpolymerized regions 106 of the partially entirely polymerized protective layer 86A and renders the adhesive lower surfaces 110 nonadhesive so that the dies 124 are easily removed without damaging or destroying the special-purpose area 126.

FIG. 20 illustrates a protective layer 150 formed of a layer of tape 151 having a polymerizable adhesive material 152 applied to a lower surface 153 of the layer of tape 151. In one embodiment, the protective layer 150 is used in a similar fashion to that described above in reference to the partially polymerized protective layer 36 of FIG. 5 where the layer of tape 151, the polymerizable adhesive material 152 (FIG. 20) correspond to the polymerized upper zone 38, the unpolymerized lower zone 40 (FIG. 5), respectively.

In an alternative embodiment, regions 158 of the polymerizable adhesive material 152 are selectively polymerized, for example, using an ultraviolet mask such as ultraviolet mask 96 of FIG. 12. In accordance with this embodiment, the protective layer 150 is used in a similar fashion to that described above in reference to the partially entirely polymerized protective layer 86A of FIG. 13 where the layer of tape 151, the regions 158 (FIG. 20) correspond to polymerized upper zone 90, polymerized regions 104A (FIG. 13) respectively.

This application is related to Glenn et al., commonly assigned and co-filed U.S. patent application Ser. No. 09/764,166, now pending, entitled "METHOD FOR FABRICATING A SPECIAL-PURPOSE DIE USING A POLYMERIZABLE TAPE", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
   a protective layer formed from a single sheet of polymerizable material, wherein said protective layer comprises:
      an upper zone; and
      a lower zone comprising an adhesive lower surface; and
   a die comprising a first surface comprising a special-purpose area, said adhesive lower surface being coupled to said first surface of said die, wherein said protective layer contacts said special-purpose area.

2. The structure of claim 1 wherein said protective layer comprises a partially polymerized protective layer.

3. The structure of claim 2 wherein said upper zone is polymerized and wherein said lower zone is unpolymerized.

4. The structure of claim 1 wherein said die comprises an image sensor chip.

5. The structure of claim 1 wherein said die comprises a micromachine chip.

6. The structure of claim 1 wherein a wafer comprises said die, said wafer comprising a scribe line visible through said protective layer.

7. The structure of claim 1 wherein a wafer comprises said die, said wafer comprising a fiducial on a bottom surface of said wafer.

8. The structure of claim further comprising:
   a saw pallet; and
   a base layer, said bottom surface of said wafer being coupled to said saw pallet by said base layer.

9. A structure comprising a protective layer formed from a single sheet of polymerizable material, wherein said protective layer comprises:
   an upper zone; and
   a lower zone comprising a first region and a second region, said first region comprising a nonadhesive lower surface, said second region comprising an adhesive lower surface.

10. The structure of claim 9 wherein said first region is polymerized.

11. The structure of claim 10 wherein said second region is unpolymerized.

12. The structure of claim 9 wherein said second region is unpolymerized.

13. The structure of claim 9 further comprising a mask, said mask exposing said first region, said mask covering said second region.

14. The structure of claim 9 further comprising a die comprising a special-purpose area on a first surface of said die, said special-purpose area being contacted by said nonadhesive lower surface.

15. The structure of claim 14 wherein said adhesive lower surface contacts said first surface of said die around said special-purpose area.

16. A structure comprising:
   means for protecting a special-purpose area of a die, said means for protecting being formed from a single sheet of polymerizable material and being coupled to said special-purpose area; and
   means for releasing said means for protecting from said special-purpose area.

17. The structure of claim 16 wherein said means for protecting comprises a polymerizable material.

18. The structure of claim 17 wherein said means for releasing comprises a radiation source.

19. A structure comprising:
   a partially polymerized protective layer comprising:
      a polymerized upper zone; and
      an unpolymerized lower zone comprising an adhesive lower surface; and
   a die comprising a top surface comprising a special-purpose area, said adhesive lower surface being coupled to said top surface of said die, wherein said partially polymerized protective layer overlies and contacts said special-purpose area.

20. A structure comprising:
   a partially polymerized protective layer comprising:
      a polymerized upper zone; and
      an unpolymerized lower zone comprising an adhesive lower surface; and
   a wafer comprises a die and a scribe line visible through said partially polymerized protective layer, said die comprising a top surface comprising a special-purpose area, said adhesive lower surface being coupled to said top surface of said die, wherein said partially polymerized protective layer overlies said special-purpose area.

21. A structure comprising a protective layer comprising:
   a polymerized upper zone; and
   a partially polymerized lower zone comprising a polymerized region and an unpolymerized region, said polymerized region comprising a nonadhesive lower surface, said unpolymerized region comprising an adhesive lower surface.

22. A structure comprising a protective layer formed from a single sheet of polymerizable material, wherein said protective layer comprises:
   an upper zone; and
   a lower zone comprising a polymerized region and an unpolymerized region, said polymerized region comprising a nonadhesive lower surface, said unpolymerized region comprising an adhesive lower surface.

23. A structure comprising:
   a protective layer formed from a single sheet of polymerizable material, wherein said protective layer comprises:
      an upper zone;
      a lower zone comprising a polymerized region and an unpolymerized region, said polymerized region comprising a nonadhesive lower surface, said unpolymerized region comprising an adhesive lower surface; and
   a mask, said mask exposing said polymerized region, said mask covering said unpolymerized region.

24. A structure comprising:

a protective layer formed from a single sheet of polymerizable material, wherein said protective layer comprises:
  an upper zone; and
  a lower zone comprising a first region and a second region, said first region comprising a nonadhesive lower surface, said second region comprising an adhesive lower surface; and a die comprising a special-purpose area on a top surface of said die, said special-purpose area being contacted by said nonadhesive lower surface.

25. A structure comprising:

a protective layer comprising:
  a polymerized upper zone; and
  a partially polymerized lower zone comprising a polymerized region and an unpolymerized region, said polymerized region comprising a nonadhesive lower surface, said unpolymerized region comprising an adhesive lower surface; and a die comprising a special-purpose area on a top surface of said die, said special-purpose area being, contacted by said nonadhesive lower surface, said top surface of said die around said special-purpose area being contacted by said adhesive lower surface.

\* \* \* \* \*